United States Patent [19]
Mohn et al.

[11] Patent Number: 5,762,714
[45] Date of Patent: Jun. 9, 1998

[54] PLASMA GUARD FOR CHAMBER EQUIPPED WITH ELECTROSTATIC CHUCK

[75] Inventors: Jon Mohn, Saratoga; Joshua Chiu-Wing Tsui, Santa Clara; Kenneth S. Collins, San Jose, all of Calif.

[73] Assignee: Applied Materials, Inc., Santa Clara, Calif.

[21] Appl. No.: 324,848

[22] Filed: Oct. 18, 1994

[51] Int. Cl.⁶ ................................................ C23C 16/00
[52] U.S. Cl. ........................................ 118/728; 118/723 E
[58] Field of Search .................. 156/345; 118/728, 118/723 E; 204/298.11, 298.15

[56] References Cited

U.S. PATENT DOCUMENTS 5,055,964  10/1991  Logan et al. .

FOREIGN PATENT DOCUMENTS

| 06017888A2 | 1/1993 | European Pat. Off. . |
| 601788 | 6/1994 | European Pat. Off. . |
| 4037125 | 7/1992 | Japan . |

*Primary Examiner*—John Niebling
*Assistant Examiner*—Joni Y. Chang
*Attorney, Agent, or Firm*—Barnes, Kisselle, Raisch, Choate, Whittemore & Hulbert, P.C.

[57] ABSTRACT

A plasma guard member that has the configuration of a flat concentric ring is used in a vacuum process chamber equipped with a plasma reaction chamber, a plasma source and a lower chamber which houses an electrostatic chuck for preventing charged particles from drifting or diffusing to the lower chamber and contact the electrostatic chuck such that the substrate holding capability of the chuck is not adversely affected.

11 Claims, 3 Drawing Sheets

PLASMA GUARD FOR CHAMBER EQUIPPED WITH ELECTROSTATIC CHUCK

FIELD OF THE INVENTION

The present invention generally relates to a vacuum chamber for etching or deposition and more particularly relates to a plasma guard installed in a vacuum chamber equipped with a plasma source and an electrostatic chuck for protecting the chuck from the adverse effect of the charged particles.

BACKGROUND OF THE INVENTION

In the continuing miniaturization of semiconductor devices, one of the keys to shrinking device geometries is the ability to construct very dense contact or interconnect structures such as that used in a multi-level metallization schemes. The critical processing step involves etching the contacts and interconnects to a dimension as small as 0.35 μm or even 0.25 μm in diameter in applications for a 64 or 256 megabit DRAMs or other high-density logic devices. To fully implement this process, high selectivity of oxide to the underlying polysilicon or silicide is a key requirement. A high-density plasma etch process utilizing a fluorine chemistry is ideal for this high selectivity etch process. A suitable equipment to be used for this process is supplied by the Applied Materials, Inc. of Santa Clara, Calif. under the tradename of Centura Omega dielectric etch system. For instance, an oxide etch process can be performed in such an equipment by etching 8,000 Å to 12,000 Å of doped oxide down to a nitride layer. The etch step uses a well-characterized $C_2F_6$ or $C_3F_8$ chemistry to etch the oxide and stopping at the nitride layer. In order to avoid or to minimize a polymer film deposition during the etch process, a high density plasma source powered by a 2 MHz RF signal is used. The source generates an ion density of about $1 \times 10^{12}$ $cm^{-3}$. Free fluorine atoms are removed or scavenged from the reaction chamber through the use of a heated silicon top plate.

In a modern etch chamber, the electrostatic wafer holding technology is frequently employed in which an electrostatic chuck electrically attracts and holds the wafer. Collins et al. describes such an electrostatic chuck in European Patent Application 601,788 A2. It is a highly desirable technique in the vacuum handling and processing of silicon wafers. In contrast to the conventional methods of holding wafers by either gravity or mechanical clamping where only slow movement is allowed during wafer handling, an electrostatic wafer holding device or an electrostatic chuck can hold wafers with a force equivalent to several tens of torr pressure. Since there are no moving parts acting on the wafer, there are no particle generation or contamination problems.

Furthermore, in a conventional mechanical clamping system, since clamping is effected around the peripheral of the wafer, special provisions must be made to compensate for the bowing at the center of the wafer caused by the pressure of cooling gas pumped in between the wafer and the pedestal supporting and cooling the wafer. In one solution, the pedestal is domed or bowed to match the wafer bowing. This requirement is eliminated in an electrostatic chuck wherein the wafer is held on a substantially planar chuck surface with an even force distributed according to the electrode layout. The electrostatic force is sufficient to prevent bowing of the wafer which also promotes uniform heat transfer over the entire wafer surface. In the normal operation of an electrostatic chuck, one or more electrodes formed in the chuck induce an electrostatic charge on the surface of a dielectric material formed over the chuck electrode and other portions of the metal wafer support that is facing the wafer, i.e., between the bottom surface of the wafer and the facing surface of the underlying metal. A typical dielectric material suitable for such purpose is polyimide although other materials are being investigated.

An electrostatic chuck is especially suited for processes in which the substrate is RF biased for a plasma-enhanced process, for instance, a high-density plasma process used in $SiO_2$ etching. To achieve uniform particle energy and flux to the substrate being processed in a typical high-density plasma reactor, it is required that the RF bias energy be uniformly coupled through the substrate being processed to the plasma. An RF bias energy is applied to the chuck on which a substrate is held such that a constant plasma sheath voltage across the surface of the substrate can be achieved.

In a vacuum chamber equipped with a high-density plasma source and an electrostatic chuck, problems sometimes arise in the operation of the chuck. High density plasma has a short debye length and consequently very small sheaths that form at boundaries of objects placed in the plasma. The debye length is defined as the distance from the plasma at which the electron density drops to 1/e of the density in the bulk plasma. It is proportional to the square root of the (electron temperature divided by the electron density). In a high density plasma, a typical electron temperature is low, i.e., on the order of a few eV while the electron density is high, i.e., on the order of $10^{11} \sim 10^{12}$ electrons per cubic centimeter. This results in a small debye length, i.e., on the order of tenths of a millimeter. Gaps larger than a few debye lengths may either undergo a gas breakdown or the plasma may be extracted into such sufficiently large gaps.

In order to avoid the voltage on the electrode of the electrostatic chuck to be influenced by the plasma, the electrode positioned in the plasma chamber must be isolated from the plasma. In a typical unipolar electrostatic chuck positioned in a high density plasma environment, the electrode which is isolated from the plasma has a voltage applied to it with respect to a ground reference. The wafer is referenced back to the same ground reference by the plasma. The effective voltage for the electrostatic clamping of the wafer is then the voltage which appears across the electrostatic chuck dielectric between the isolated electrode and the wafer. The voltage applied to the isolated electrode may be positive or negative with respect to the chamber ground, however, the electrostatic force depends on the algebraic difference between the wafer and the isolated electrode.

When the gaps around an electrostatic chuck exceed several debye lengths, plasma may either be generated in such gaps or may be extracted into such gaps. When plasma contacts the electrostatic chuck imperfect dielectric or the electrostatic chuck electrode, a current may flow between the electrostatic chuck and the plasma. Due to a non-zero output impedance of the electrostatic chuck voltage source, the voltage at the electrostatic chuck electrode is affected. Typically, the magnitude of the electrostatic chuck voltage is reduced when a current flows between the chuck and the plasma and thus reducing the electrostatic force. The solution to the problem according to the invention is to shield the electrostatic chuck from the high density plasma by limiting gaps between the chuck and a plasma guard ring to less than several debye lengths. Plasma is prevented from being generated in such gaps or being extracted into the gaps.

It is therefore an object of the present invention to provide a plasma guard ring that can be installed in a vacuum chamber to isolate the upper chamber, i.e., the plasma reaction chamber from the low chamber that houses the electrostatic chuck to prevent charged particles from drifting or diffusing into the lower chamber.

It is another object of the present invention to provide a plasma guard ring that can be used to isolate a plasma reaction chamber from other chamber hardware and that can be easily installed without any major modification of the chamber hardware.

SUMMARY OF THE INVENTION

In accordance with the present invention, a plasma guard member is installed in a vacuum chamber equipped with a plasma source and an electrostatic chuck to prevent charged particles from drifting or diffusing to outside of the plasma reaction region overlying the electrostatic chuck and to adversely affect chamber hardware.

In a preferred embodiment, a plasma guard member in the configuration of at least one flat concentric ring is installed as part of the chamber hardware between the electrostatic chuck and the plasma reaction chamber such that charged particles cannot escape outside of the reaction region to adversely affect the electrostatic chuck. The modification to a vacuum chamber can be easily made by the installation of either a single or a multiple number of plasma guards. The guards can be made of any suitable materials that can withstand high temperature exposures while maintaining its strength without generating contaminating particles. Suitable materials to be used can be such as quartz, silicon, silicon carbide and silicon nitride or any other high heat and high strength materials. The guard is typically made of a brittle material and therefore a gap of up to 375 μm should be maintained between the surfaces of the guard and the substrate such that any breakage of the guard and particles generated therefrom can be avoided. An overlap of at least 2.5 mm along the outer peripheral edge of the substrate and the inner peripheral edge of the guard in the radial direction is desirable to insure the sealing effect of the guard.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED EMBODIMENT

The present invention provides an improved vacuum chamber for etching, deposition, or other processes that is equipped with a plasma source and an electrostatic chuck wherein the chamber is further equipped with a plasma guard member such that the substrate holding efficiency of the electrostatic chuck is not adversely affected by the charged particles which would otherwise drift or diffuse from the plasma reaction chamber.

Figure 1:
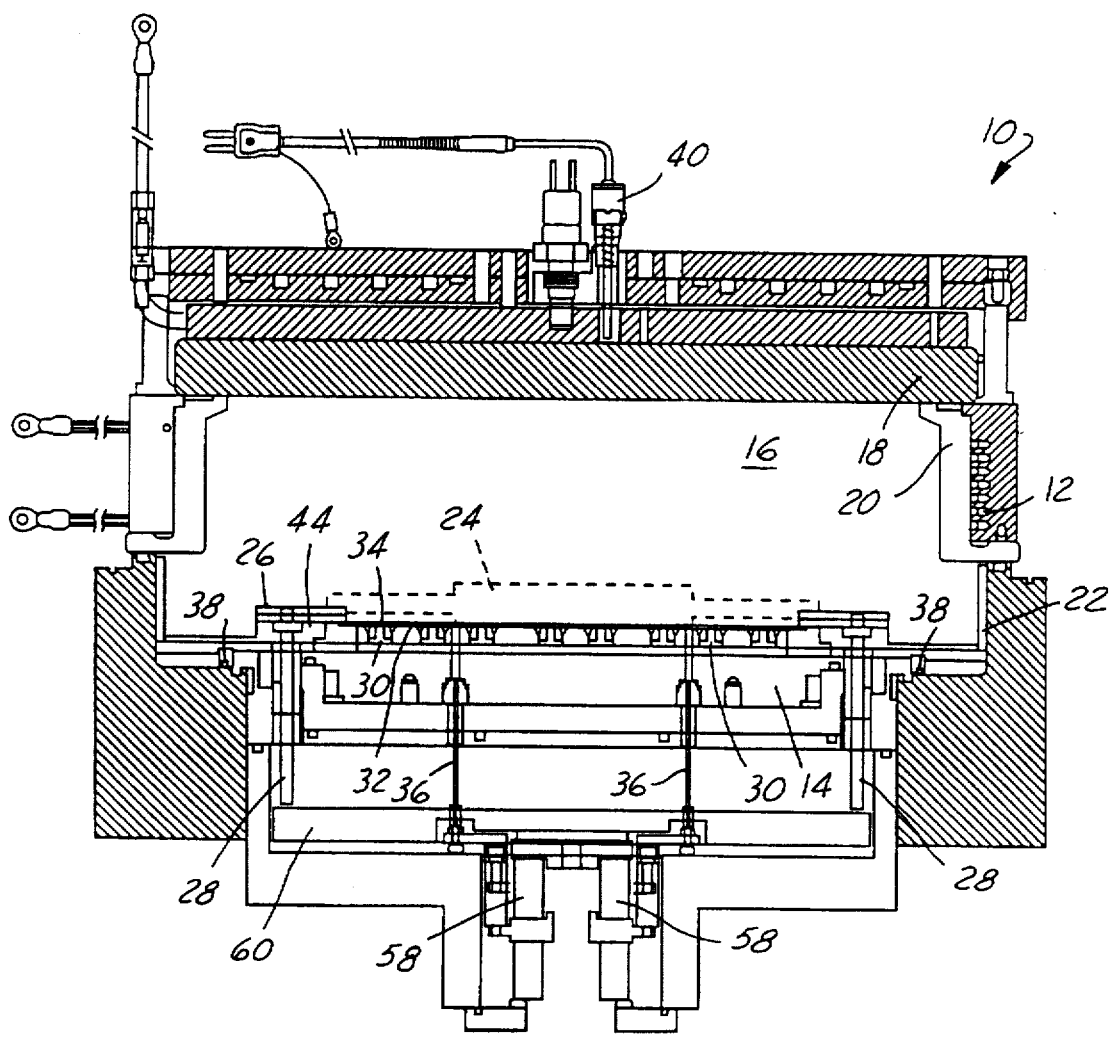
FIG. 1 is a cross-sectional view of a vacuum chamber equipped with a plasma source and an electrostatic chuck.

Referring initially to FIG. 1, there is shown a cross-sectional view of a typical vacuum chamber 10 for an etcher equipped with a coil antenna 12 acting as a plasma source and an electrostatic chuck 14. A plasma reaction region 16 is formed by a silicon ceiling block 18, a dome sidewall 20, a chamber wall liner 22 and the electrostatic chuck 14. The dome sidewall 20 and the chamber wall liner 22 are normally made of a quartz material. The chamber wall liner 22 has an opening 24 (shown in dotted line) to allow the passage of a wafer paddle for loading and unloading substrates (or wafers). Inside the chamber wall liner 22, plasma guards 26 having the configuration of flat concentric rings are positioned by lift pins 28. The pins 28 lift the guard 26 away from the wafer 34 and the electrostatic chuck 14 when the wafer is being transported to or from the chuck.

The electrostatic chuck 14 has a multiplicity of cooling gas channels 30 provided at its top surface 32. The cooling gas channels 30 are used to circulate a thermal transfer gas such as helium at a pressure between 5 to 30 torr at the bottom side of wafer 34 for transferring heat from the wafer to the water-cooled chuck 14 during the etching process. The feed lines for the cooling gas to the channel 30 are not shown. The chuck 14 is aligned by an electrostatic chuck collar 56. The collar 56 can be made out of silicon, quartz or silicon carbide. The height of ledge 68 of the collar 56 is designed to provide a gap between the wafer 34 and the plasma guard 26. The etching gas is fed into the chamber through gas inlets 38. A thermocouple 40 is mounted on top of the silicon block 18 for controlling temperature.

Figure 2:
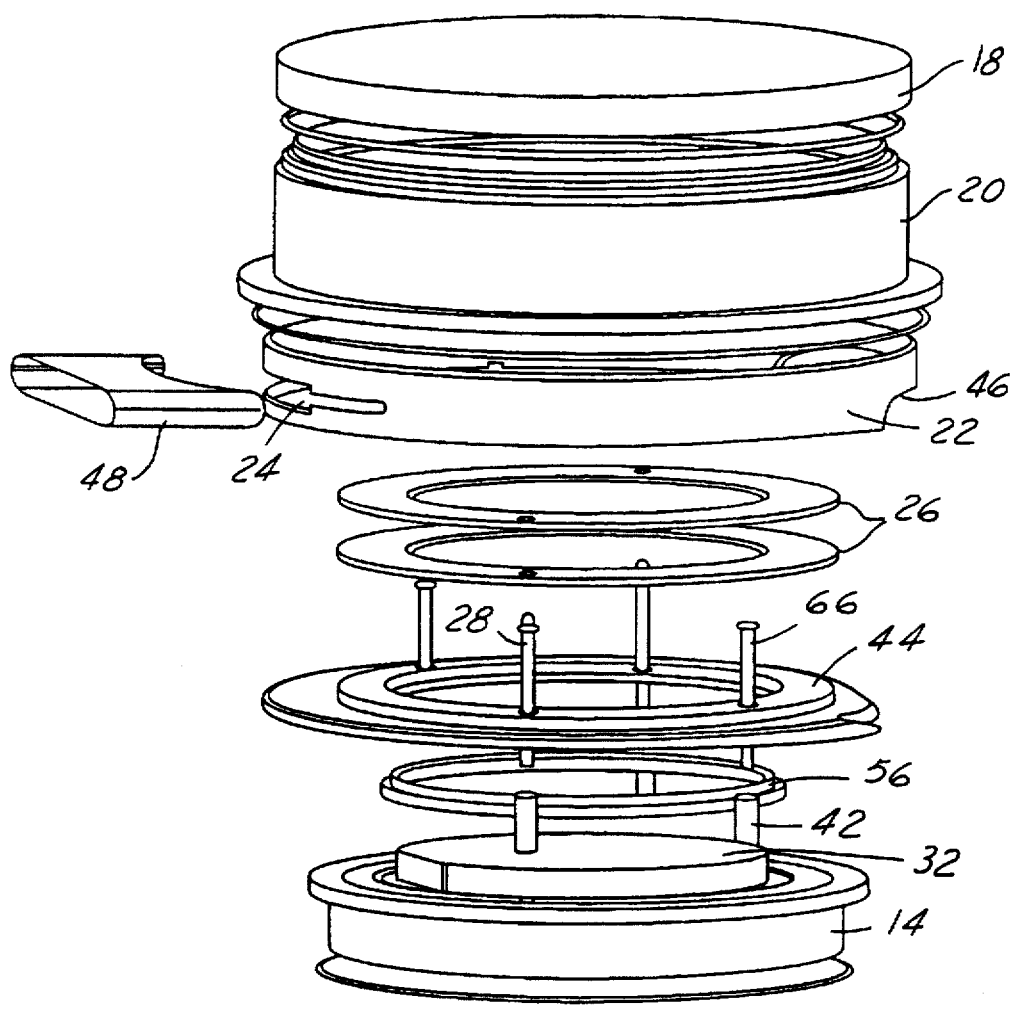
FIG. 2 is a perspective view of the various components that comprise the vacuum chamber.

A perspective view of the essential parts surrounding the plasma reaction region 16 is shown in FIG. 2. The silicon ceiling block 18 forms the top boundary of the reaction region 16 and rests on the dome sidewall 20 and the chamber wall liner 22, which bridges the gap between the top surface 32 of the electrostatic chuck 14 and the side of the chamber wall liner 22 to form the chamber interior. A multiplicity of lift pin guides 42 inserted in the chuck 14 are used to guide the lift pins 36. A set of four wafer lift pins 36 is frequently used. The plasma guard 26 rests on the electrostatic chuck collar 56 and is positioned in place by lift pins 28 and 66. An opening 46 in the chamber wall liner 22 is used to evacuate spent gas from the chamber. A chute 48 connected to the chamber wall liner 22 at the paddle opening 24 surrounds the passage is used to load or unload wafers from chamber 16.

The loading of a wafer 34 into the chamber 16 can be described as follows: first the wafer lift pins 36 are down and the plasma guard lift pins 28 and 66 are up for the chamber to accept a wafer 34. A robot blade (not shown) transfers wafer 34 into the chamber 16. The wafer lift pins 36 lift the wafer 34 off the robot blade. The wafer lift pins 36 and the plasma guard lift pins 28 and 66 are lowered at the same time; this lowers the wafer to the electrostatic chuck 14, and the plasma guard 26 onto the electrostatic chuck collar 56. The wafer 34 is then processed. The plasma guard lift pins 28 and 66 are again raised and the wafer 34 is dechucked from the electrostatic chuck 14. The lift pins 36 raise the wafer 34 from the electrostatic chuck and then, the robot enters the chamber 16 to remove the wafer 34.

Figure 3:
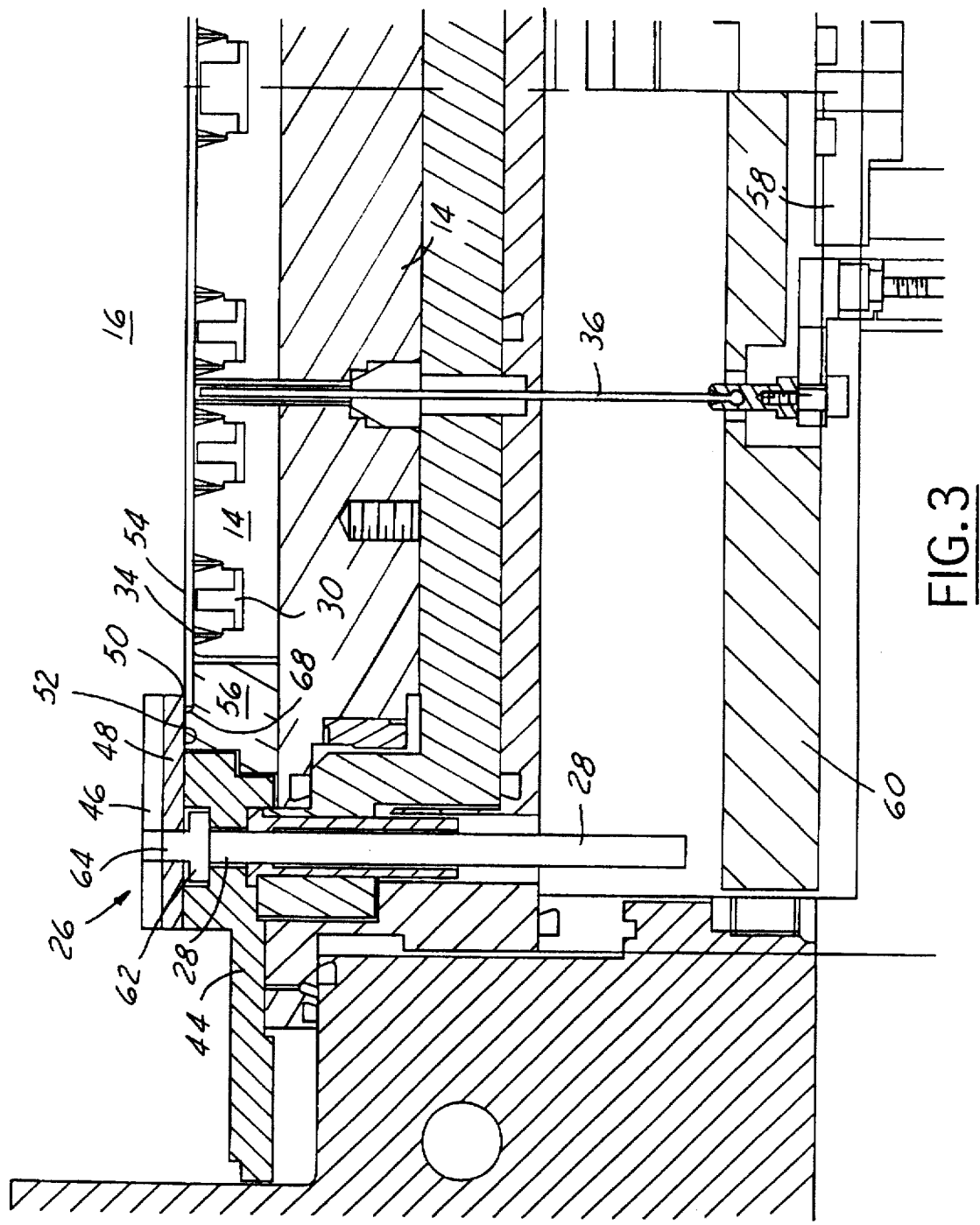
FIG. 3 is an enlarged partial cross-sectional view showing the present invention plasma guard in relation to the substrate and the electrostatic chuck.

A detailed enlarged partial sectional view of the plasma guard 26 and the electrostatic chuck 14 are shown in FIG. 3. The plasma guard 26 shown in FIG. 3 consists of two flat concentric rings 46 and 48. In this combination, the top ring 46 is made of a silicon material while the bottom ring 48 is made of a quartz material. The thickness of the ring is in the range of between 2 and 6 mm. The outside diameter of the ring is approximately 273 mm, while the inside diameter depends on the size of the wafer processed. The plasma guard 26 is designed to have a surface conforming to the flats or notches of a wafer. It is lifted by a lift spider 60, which is actuated by a pneumatic lift bellows assembly 58.

It should be noted that a gap 50 of no higher than 375 μm should be maintained between the bottom surface 52 of the bottom ring 48 and the top surface 54 of wafer 34. The gap is provided by the height of ledge 68 of the electrostatic chuck collar 56. The gap is desirable such that there is no direct contact between the ring 48 and the wafer 34, which are both made of very brittle materials. Maintaining a suitable gap between the ring and the wafer eliminates the possibility of any breakage in either part and the resulting generation of contaminating particles. The gap should be small enough such that charged particles chamber travel through the gap to reach the lower chamber. Therefore, the gap should be no greater than 1~3 debye length.

The inner diameter (that is, the diameter of the central hole) of plasma guard 26 is smaller than the diameter of wafer 34 by approximately 2.5 mm or more. This overlapped peripheral area insures that charged particles from the reaction region 16 do not drift, diffuse or generate through the gap 50 to adversely affect on the electrostatic chuck 14.

It should be noted that while plasma guard 26 shown in FIG. 3 consists of two plasma guard rings 46 and 48, any suitable combinations of rings or a single ring can be used in the present invention. The materials chosen for the plasma guard ring should have high heat endurance and high strength.

During an etching process, the plasma guard is normally heated by the heating source of the chamber to a temperature of over 150° C. to avoid the formation of polymer films on its surfaces. A suitable combination of materials is quartz and silicon as that shown in FIG. 3. Other suitable materials include silicon carbide (99.9% pure) and silicon nitride (99.9% pure) or any other high heat and high strength materials. The requirement that the plasma guard material must not produce any particle contamination in the reaction chamber should be satisfied. The plasma guard 26 is positioned in place by a multiplicity of lift pins 28 and 66. The lift pins 28 have locating pins 64 above a stepped surface 62 to locate the plasma guard 26 while lift pins 66 do not have such stepped surface. In most instances, four of these lift pins 28 and 66 adequately position the plasma guard in place.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention.

The embodiments of the invention in which an exclusive property or privilege is claimed are defined as follows:

1. A vacuum process chamber for a semiconductor substrate comprising:

a plasma source capable of generating charged particles of an active gas, an electrostatic chuck for electrostatically holding a semiconductor substrate thereon, at least one plasma guard member positioned juxtaposed to and overlapping said semiconductor substrate, said at least one plasma guard member comprise a first concentric ring made of silicon and a second concentric ring made of quartz, whereby said at least one plasma guard member prevent the charged particles of said active gas from contacting said electrostatic chuck.

2. A vacuum process chamber according to claim 1, wherein a gap smaller than three debye lengths of a plasma in the reactor is maintained between the plasma guard member and the semiconductor substrate.

3. A vacuum process chamber for a semiconductor substrate according to claim 1, wherein said chamber is selected from the group consisting of an etch chamber, a chemical vapor deposition chamber and a physical vapor deposition chamber.

4. A vacuum process chamber for a semiconductor substrate according to claim 1, wherein said chamber is an etch chamber.

5. A vacuum process chamber for a semiconductor substrate according to claim 1, wherein said at least one plasma guard member comprises a concentric ring having a flat area on its top and bottom surfaces.

6. A vacuum process chamber for processing semiconductor substrates according to claim 1, wherein said at least one plasma guard member being positioned juxtaposed to said semiconductor substrate further overlap the edge of said semiconductor substrate by a minimum of 2.5 mm in the radial direction.

7. A vacuum process chamber for processing semiconductor substrates according to claim 1, wherein said at least one plasma guard member does not contact said semiconductor substrate.

8. A vacuum process chamber for processing semiconductor substrates according to claim 1, wherein said at least one plasma guard member maintains a gap that is smaller than 375 µm from said semiconductor substrate.

9. A vacuum process chamber for processing semiconductor substrates according to claim 1, wherein said at least one plasma guard member maintains a gap that is smaller than 250 µm from said semiconductor substrate.

10. A vacuum process chamber for processing semiconductor substrates according to claim 1, wherein said at least one plasma guard member maintains a gap smaller than three debye length from said semiconductor substrate.

11. A vacuum process chamber for processing semiconductor substrates according to claim 9, wherein said substrates are semiconductor wafers.

* * * * *